(12) United States Patent
Hirobe (10) Patent No.: US 10,804,861 B2
(45) Date of Patent: Oct. 13, 2020

(54) POWER AMPLIFICATION MODULE, METHOD FOR CONTROLLING POWER AMPLIFICATION MODULE, AND HIGH-FREQUENCY FRONT END CIRCUIT

(71) Applicant: Murata Manufacturing Co., Ltd., Kyoto (JP)

(72) Inventor: Masakazu Hirobe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/519,385

(22) Filed: Jul. 23, 2019

(65) Prior Publication Data

US 2019/0348954 A1 Nov. 14, 2019

Related U.S. Application Data

(63) Continuation of application No. PCT/JP2018/001741, filed on Jan. 22, 2018.

(30) Foreign Application Priority Data

Jan. 24, 2017 (JP) .................................. 2017-010676

(51) Int. Cl.
*H03F 3/04* (2006.01)
*H03F 1/32* (2006.01)
(Continued)

(52) U.S. Cl.
CPC .................. *H03F 1/32* (2013.01); *H03F 3/21* (2013.01); *H04B 1/16* (2013.01); *H03F 1/302* (2013.01);
(Continued)

(58) Field of Classification Search
CPC ........ H03F 1/32; H03F 3/21; H03F 2200/171; H03F 2200/451; H03F 2200/18;
(Continued)

(56) References Cited

U.S. PATENT DOCUMENTS 9,837,965 B1 * 12/2017 Wagh ..................... H03F 1/0227
9,893,687 B2 * 2/2018 Lehtola ..................... H03F 3/19
(Continued)

FOREIGN PATENT DOCUMENTS

JP   2004-236173 A    8/2004
JP   2009-164930 A    7/2009
(Continued)

OTHER PUBLICATIONS

International Search Report for PCT/JP2018/001741 dated Apr. 17, 2018.
Written Opinion for PCT/JP2018/001741 dated Apr. 17, 2018.

*Primary Examiner* — Khanh V Nguyen
(74) *Attorney, Agent, or Firm* — Pearne & Gordon LLP (57) ABSTRACT

A power amplification module includes an amplification circuit, a biasing circuit, a constant voltage generation circuit, a constant current generation circuit, a switching unit, and a control unit for controlling a switching operation of the switching unit, and the control unit causes the switching unit to perform switching to connect the constant voltage generation circuit to an input end of the biasing circuit when an output mode is a first output mode in which a high-frequency signal having no less than a predetermined output power is outputted from the amplification circuit, and causes the switching unit to perform switching to connect the constant current generation circuit to the input end of the biasing circuit when the output mode is a second output mode in which a power less than the predetermined output power is outputted from the amplification circuit.

15 Claims, 4 Drawing Sheets

(51) Int. Cl.
*H03F 3/21* (2006.01)
*H04B 1/16* (2006.01)
*H03F 1/30* (2006.01)

(52) U.S. Cl.
CPC .... *H03F 2200/171* (2013.01); *H03F 2200/18* (2013.01); *H03F 2200/451* (2013.01)

(58) Field of Classification Search
CPC .......... H03F 1/30; H03F 1/0261; H03F 3/245; H03F 1/302; H03F 1/301; H03F 1/34; H04B 1/16; H04B 1/0475; H04B 2001/0441; H03G 3/3042; H03G 3/3047; H03G 3/3036

See application file for complete search history.

(56) References Cited

U.S. PATENT DOCUMENTS

| | | | |
|---|---|---|---|
| 2003/0001677 A1 | 1/2003 | Taniguchi | |
| 2004/0150479 A1 | 8/2004 | Abe | |
| 2009/0174474 A1 | 7/2009 | Matsuzuka | |
| 2016/0181989 A1 | 6/2016 | Shi | |
| 2017/0163223 A1* | 6/2017 | Shimamoto | ............... H03F 3/19 |
| 2018/0294788 A1* | 10/2018 | Ishihara | ................. H03F 1/565 |

FOREIGN PATENT DOCUMENTS

| | | |
|---|---|---|
| JP | 2014-053759 A | 3/2014 |
| WO | 02/45254 A1 | 6/2002 |

\* cited by examiner

POWER AMPLIFICATION MODULE, METHOD FOR CONTROLLING POWER AMPLIFICATION MODULE, AND HIGH-FREQUENCY FRONT END CIRCUIT

This is a continuation of International Application No. PCT/JP2018/001741 filed on Jan. 22, 2018 which claims priority from Japanese Patent Application No. 2017-010676 filed on Jan. 24, 2017. The contents of these applications are incorporated herein by reference in their entireties.

BACKGROUND OF THE DISCLOSURE

Field of the Disclosure

The present disclosure relates to a power amplification module, a method for controlling the power amplification module, and a high-frequency front end circuit.

Description of the Related Art

In recent years, in order to support a plurality of modulation schemes with a single power amplifier (PA), a multi-mode power amplifier for switching the power sources connected to a biasing circuit according to the modulation schemes has been developed (see, for example, Patent Document 1).

In the power amplifier described in Patent Document 1, when a high-frequency signal without an amplitude modulation component is operated in a GSM (registered trademark) (global system for mobile communications) scheme, a constant current source is used for the biasing circuit to realize a high efficiency operation. On the other hand, when a high-frequency signal with an amplitude modulation component is operated in an EDGE (Enhanced Data GSM (registered trademark) Environment) or a 3G scheme, a constant voltage source is used for the biasing circuit to realize a linear operation of the power amplifier.

Patent Document 1: U.S. Patent Application Publication No. 2016/0181989

BRIEF SUMMARY OF THE DISCLOSURE

In the power amplifier according to the related art, when a high-frequency signal with an amplitude modulation component is inputted, a constant voltage source is used regardless of the magnitude of an output power from the power amplifier. When a constant voltage source is used in a mode supporting a case in which an output power is low (low output mode), there is a problem that gain increases as the output power increases, and the linearity cannot be maintained. Thus, in the low output mode, it is preferable to use a constant current source in order to maintain the linearity. On the other hand, when a constant current source is used in a case where an output power is large, there is a problem that gain decreases as the output power increases, and the linearity in a vicinity of a saturation output power cannot be maintained.

In view of the above problems, it is an object of the present disclosure to provide a power amplification module, a method for controlling the power amplification module, and a high-frequency front end circuit capable of realizing a linear operation in both a high output mode and a low output mode.

In order to achieve the above object, a power amplification module according to an aspect of the present disclosure includes an amplification circuit for amplifying a high-frequency signal with an amplitude modulation component, a biasing circuit for biasing the amplification circuit to an operating point, a constant voltage generation circuit for supplying a constant voltage to the biasing circuit, a constant current generation circuit for supplying a constant current to the biasing circuit, a switching unit for performing a switching operation to switch a connection destination of an input end of the biasing circuit to the constant voltage generation circuit or the constant current generation circuit, and a control unit for controlling a switching operation of the switching unit according to an output mode of a high-frequency signal amplified by the amplification circuit, in which the control unit, when the output mode is a first output mode in which a high-frequency signal having no less than a predetermined output power is outputted from the amplification circuit, causes the switching unit to perform switching to connect the constant voltage generation circuit to the input end of the biasing circuit, and when the output mode is a second output mode in which a power less than the predetermined output power is outputted from the amplification circuit, causes the switching unit to perform switching to connect the constant current generation circuit to the input end of the biasing circuit.

Thus, when the output mode is the first output mode (high output mode), the control unit causes the switching unit to perform switching to connect the constant voltage generation circuit to the input end of the biasing circuit. Accordingly, in the first output mode, the linearity of gain of the amplification circuit can be maintained. Further, when the output mode is the second output mode (low output mode), the control unit causes the switching unit to perform switching to connect the constant current generation circuit to the input end of the biasing circuit. Accordingly, in the second output mode, an increase in gain of the amplification circuit due to an increase in an output power is suppressed, and the linearity can be maintained. Thus, it is possible to provide a power amplification module capable of realizing a linear operation in both the first output mode and the second output mode. As a result, a linear operation can be realized even in a state in which an idle current is kept low in the power amplification module.

In addition, the control unit may further determine, when a high-frequency signal with the amplitude modulation component is inputted to the amplification circuit, the output mode to be the first output mode or the second output mode.

Accordingly, when the high-frequency signal with the amplitude modulation component is inputted to the amplification circuit, the control unit can determine the output mode according to an output mode signal received from an outside of the control unit, for example, and cause the switching unit to perform switching according to the determined output mode. Thus, it is possible to provide a power amplification module capable of realizing a linear operation in both the first output mode and the second output mode.

Also, the control unit may determine the output mode to be the second output mode in the waiting time in which an output of the amplification circuit is suppressed.

As a result, since an operation is performed in the second output mode in a low output operation time, such as in the waiting time, in a case in which a distance from a receiver (base station or the like) is small, or the like, an idle current in the low output operation time can be kept low.

Further, a measuring unit for measuring an output power of the amplification circuit may be further included, and the control unit, when an output power measured by the measuring unit is no less than the predetermined output power, may determine the output mode to be the first output mode, and when an output power measured by the measuring unit is less than the predetermined output power, may determine the output mode to be the second output mode.

Thus, since a power outputted from the amplification circuit is measured by the measuring unit, and the output mode is determined from the measured power, the output mode can be selected according to an actual output, thereby realizing a linear operation of the power amplification module.

Further, the predetermined output power may be 17 dBm.

Thus, at least in communication using the 3G scheme, or a 4G scheme, a linear operation of the power amplification module can be realized.

Further, a method for controlling a power amplification module according to an aspect of the present disclosure includes determining, when a high-frequency signal with an amplitude modulation component is inputted to an amplification circuit, an output mode of a high-frequency signal outputted from the amplification circuit to be a first output mode in which a high-frequency signal having no less than a predetermined output power is outputted, or to be a second output mode in which a power less than the predetermined output power is outputted, causing, when the output mode is the first output mode, a switching unit to connect a constant voltage generation circuit for supplying a constant voltage to an input end of a biasing circuit for biasing the amplification circuit to an operating point, and causing, when the output mode is the second output mode, the switching unit to connect a constant current generation circuit for supplying a constant current to the input end of the biasing circuit.

When the output mode is the first output mode (high output mode), the control unit causes the switching unit to perform switching to connect the constant voltage generation circuit to the input end of the biasing circuit. Accordingly, in the first output mode, the linearity of gain of the amplification circuit can be maintained. Further, when the output mode is the second output mode (low output mode), the control unit causes the switching unit to perform switching to connect the constant current generation circuit to the input end of the biasing circuit. Accordingly, in the second output mode, an increase in the gain of the amplification circuit due to an increase in an output power is suppressed, and the linearity can be maintained. Thus, it is possible to provide a power amplification module capable of realizing a linear operation in both the first output mode and the second output mode. As a result, the linear operation can be realized even in a state in which an idle current is kept low in the power amplification module.

Further, the predetermined output power may be 17 dBm.

Thus, at least in the communication using the 3G scheme, or the 4G scheme, a linear operation of the power amplification module can be realized.

Also, a high-frequency front end circuit according to an aspect of the present disclosure includes a power amplification module having the above-described characteristics, and an RFIC having a determination unit for determining an output mode of a high-frequency signal amplified by the amplification circuit of the power amplification module.

Accordingly, according to the output mode determined by the determination unit of the RFIC, the control unit causes the switching unit to perform switching to connect the constant voltage generation circuit or a constant current generation circuit to the input end of the biasing circuit. Thus, a linear operation can be realized regardless of whether the determined output mode is the first output mode or the second output mode. Accordingly, a linear operation can be realized even in a state in which an idle current is kept low in the high-frequency front end circuit.

Further, the determination unit may determine the output mode, based on a distance between the power amplification module and a receiver for receiving a high-frequency signal outputted from the power amplification module.

Accordingly, the output mode can be changed according to the distance from the receiver, so that a linear operation of the output mode can be realized, and a high-frequency signal can be efficiently outputted from the front end circuit.

Further, the determination unit may determine the predetermined output power, based on a distance between the power amplification module and a receiver for receiving a high-frequency signal outputted from the power amplification module.

Accordingly, the predetermined output power can be determined according to the distance from the receiver, and the output mode can be changed, so that the linear operation of the output mode can be realized, and a high-frequency signal can be efficiently outputted from the front end circuit.

According to the present disclosure, it is possible to provide a power amplification module, a method for controlling the power amplification module, and a high-frequency front end circuit capable of realizing a linear operation in both the high output mode and the low output mode.

DETAILED DESCRIPTION OF THE DISCLOSURE

Hereinafter, embodiments of the present disclosure will be described. Note that, any of the embodiments described below shows a preferred specific example of the present disclosure. Thus, numerical values, shapes, materials, constituent elements, arrangement positions and connection configurations of the constituent elements, and the like shown in the following embodiments are merely examples, and are not intended to limit the present disclosure. Thus, among the constituent elements in the following embodiments, constituent elements not described in independent claims showing the most significant concept of the present disclosure will be described as arbitrary constituent elements.

Further, each of the drawings is a schematic diagram, and is not necessarily shown strictly. In each of the drawings, the same reference numerals are given to substantially the same configurations, and redundant description thereof will be omitted or simplified.

First Embodiment

A high-frequency module 1 and a power amplification module 10 according to a first embodiment will be described below with reference to FIG. 1 through FIG. 3B.

[1. Configuration of High-Frequency Module]

Figure 1:
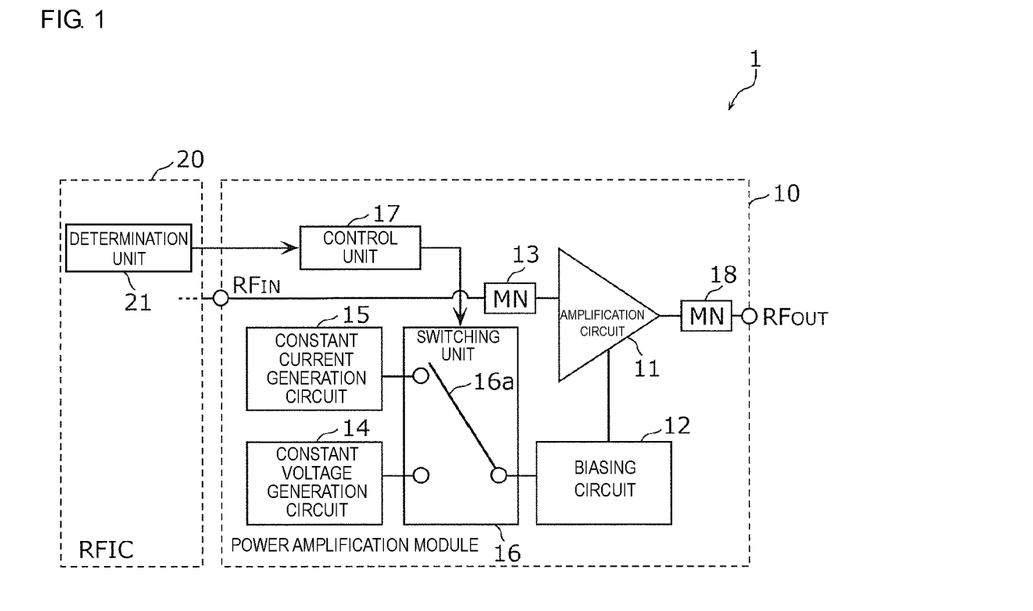
FIG. 1 is a schematic diagram showing a configuration of a power amplification module according to a first embodiment.

First, a configuration of the high-frequency module 1 will be described. FIG. 1 is a schematic diagram showing the configuration of the high-frequency module 1 according to the present embodiment.

The high-frequency module 1 is a high-frequency module mounted in a mobile communication device (terminal) such as a mobile phone. The high-frequency module 1 transmits or receives a high-frequency signal to and from a receiver by the 3G scheme or the 4G scheme using a high-frequency signal with an amplitude modulation component, for example. Here, the receiver refers to an apparatus having a function capable of receiving a high-frequency signal outputted from the high-frequency module 1, and refers to, for example, another mobile communication device, a base station, or the like.

As shown in FIG. 1, the high-frequency module 1 includes the power amplification module 10 and an RFIC 20.

The power amplification module 10 amplifies a power of a high-frequency signal $RF_{IN}$ outputted from the power amplification module 10 to a level necessary for transmitting to a receiver, and outputs an amplified high-frequency signal $RF_{OUT}$.

The power amplification module 10 includes an amplification circuit 11, a biasing circuit 12, a matching circuit (MN: Matching Network) 13, a constant voltage generation circuit 14, a constant current generation circuit 15, a switching unit 16, a control unit 17 (e.g., a controller or a processor), and a matching circuit 18. Further, the RFIC 20 includes a determination unit 21.

Figure 2A:
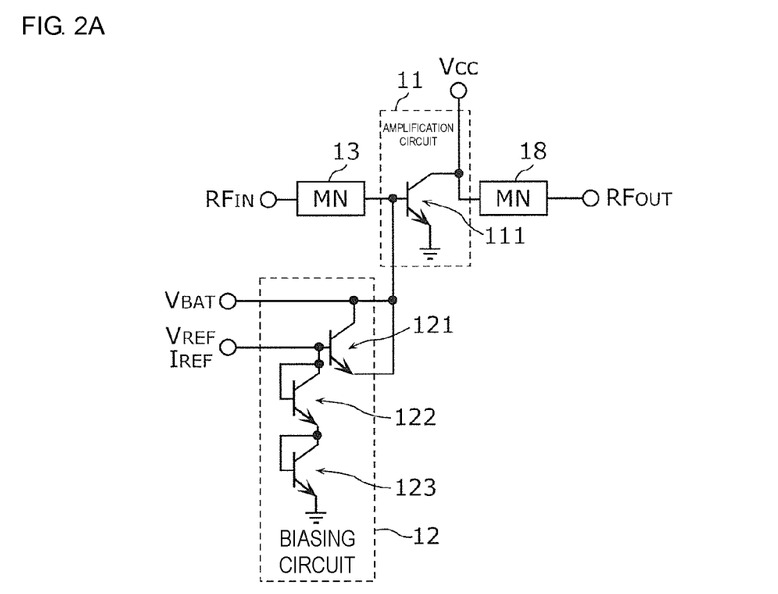
FIG. 2A is a circuit diagram showing a configuration of an amplification circuit and a biasing circuit according to the first embodiment.

FIG. 2A is a circuit diagram showing a configuration of the amplification circuit 11 and the biasing circuit 12.

The amplification circuit 11 amplifies the high-frequency signal $RF_{IN}$ with an amplitude modulation component inputted to the amplification circuit 11, and outputs the amplified high-frequency signal $RF_{OUT}$. As shown in FIG. 2A, the amplification circuit 11 includes a transistor 111. The transistor 111 may be, for example, a transistor such as a Heterojunction Bipolar Transistor (HBT) or the like.

As shown in FIG. 2A, the high-frequency signal $RF_{IN}$ is inputted to a base of the transistor 111 through the matching circuit 13. Further, an output side (bias output) of the biasing circuit 12 to be described later is connected to the base of the transistor 111.

A power supply voltage $V_{CC}$ is applied to a collector of the transistor 111. The power supply voltage $V_{CC}$ is a voltage at a predetermined level generated by a DCDC converter, for example. Further, the amplified high-frequency signal $RF_{OUT}$ is outputted from the collector of the transistor 111. The amplified high-frequency signal $RF_{OUT}$ is further outputted to an outside of the power amplification module 10 through the matching circuit 18.

Note that, the amplification circuit 11 may have a configuration in which a resistor is connected to the base of the transistor 111, and an inductor is connected to the collector of the transistor 111, or the like. Further, a voltage applied to the collector of the transistor 111 may be, for example, a battery voltage $V_{BAT}$ supplied from a battery used in a mobile communication device or the like, instead of the power supply voltage $V_{CC}$ at the predetermined level.

The biasing circuit 12 is a circuit for biasing the transistor 111 constituting the amplification circuit 11 to an operating point, by using a constant voltage $V_{REF}$ supplied from the constant voltage generation circuit 14 or a constant current $I_{REF}$ supplied from the constant current generation circuit 15, which will be described later.

The biasing circuit 12 includes transistors 121, 122 and 123, as shown in FIG. 2A. The transistors 121, 122 and 123 are, for example, transistors such as an HBT.

Transistors 122 and 123 are connected in series between a base of the transistor 121 and a ground. Further, the constant voltage $V_{REF}$ supplied from the constant voltage generation circuit 14 and the constant current $I_{REF}$ supplied from the constant current generation circuit 15, which will be described later, are applied to the base of the transistor 121. The battery voltage $V_{BAT}$, for example, is applied to a collector of the transistor 121. An emitter of the transistor 121 is the bias output of the biasing circuit 12, and is connected to the base of the transistor 111 in the amplification circuit 11.

Note that, in the biasing circuit 12, each of the base and the collector of the transistor 121 may further have a resistor.

The matching circuit 13 is a circuit for matching the input impedance of the amplifier circuit 11, and the matching circuit 18 is a circuit for matching the output impedance of the amplification circuit 11. The matching circuits 13 and 18 are constituted by using, for example, a capacitor and an inductor. The matching circuit 13 is provided on an input side of the amplification circuit 11, and the matching circuit 18 is provided on an output side of the amplification circuit 11.

Figure 2B:
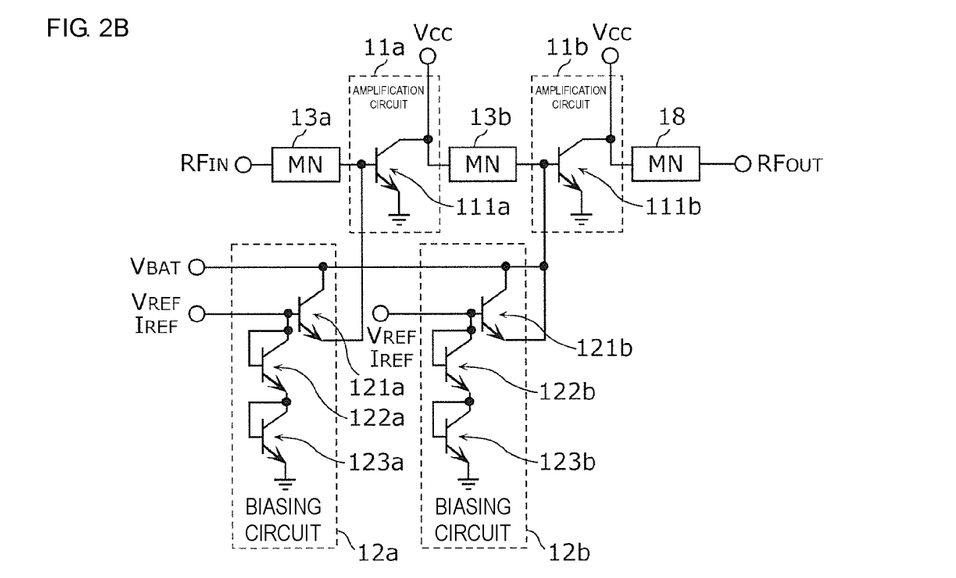
FIG. 2B is a circuit diagram showing another configuration of the amplification circuit and the biasing circuit according to the first embodiment.

Note that, a configuration may be adopted in which the amplification circuit 11 and the biasing circuit 12 are arranged in a plurality of stages. FIG. 2B is a circuit diagram showing another configuration of the amplification circuit 11 and the biasing circuit 12. As shown in FIG. 2B, a configuration may be adopted in which the amplification circuit 11 and the biasing circuit 12 are arranged in two stages, for example, which include an amplification circuit 11a and a biasing circuit 12a, and an amplification circuit 11b and a biasing circuit 12b. In this case, a matching circuit 13a is connected to an input side of the amplification circuit 11a, and a matching circuit 13b is connected to an input side of the amplification circuit 11b.

By configuring the amplification circuit 11 and the biasing circuit 12 in a plurality of stages, it is possible to increase the gain of the amplification circuit 11. When the gain of the amplification circuit 11 is increased, although the influence by the fluctuation in the bias output from the biasing circuit 12 is also increased, a voltage supplied to the biasing circuit 12 is a constant voltage or a constant current, so that the fluctuation in the bias output is suppressed. Accordingly, the fluctuation in the gain of the amplification circuit 11 can be suppressed, and the linearity of a high-frequency signal amplified by the power amplification module 10 can be enhanced.

The constant voltage generation circuit 14 is a circuit that serves as a driving source of the biasing circuit 12. Specifically, the constant voltage $V_{REF}$ is generated from the battery voltage $V_{BAT}$, and is supplied to the biasing circuit 12. As a result, the biasing circuit 12 can supply a constant voltage to a base of the amplification circuit 11.

Although not shown in the figure, the constant voltage generation circuit 14 includes, for example, a band gap circuit, an operational amplifier, a resistor, and a capacitor. The band gap circuit generates a band gap reference voltage (for example, about 1.2 V) that does not depend on the fluctuation in a power supply voltage, from a power supply voltage, such as the battery voltage $V_{BAT}$. A non-inverting amplification circuit is constituted by the operational amplifier and the resistor, and the non-inverting amplifier circuit amplifies the band gap reference voltage with gain corresponding to a resistance value of each resistor, thereby generating the constant voltage $V_{REF}$. A transistor constituting the operational amplifier may be, for example, an MOSFET or a bipolar transistor. Further, the capacitor is a decoupling capacitance for suppressing the influence by a current fed back from the amplification circuit 11. Note that, a configuration of the constant voltage generation circuit 14 is not limited to the configuration described above, and may be other configurations.

Note that, the constant voltage generation circuit 14 and the amplification circuit 11 may be formed on the same substrate or may be formed on respective different substrates. For example, the constant voltage generation circuit 14 may be constituted using an MOS Field-Effect Transistor (MOSFET), and the amplification circuit 11 may be constituted using a transistor such as a heterojunction bipolar transistor (HBT). When an HBT is used for the amplification circuit 11, for example, SiGe, GaAs, InP, GaN or the like may be used as a material of a substrate constituting the HBT.

The constant current generation circuit 15 is a circuit that serves as a driving source of the biasing circuit 12, similarly to the constant voltage generation circuit 14. The constant current generation circuit 15 generates the constant current $I_{REF}$ and supplies the constant current $I_{REF}$ to the biasing circuit 12. As a result, the biasing circuit 12 can supply a constant current to the base of the amplification circuit 11.

Although not shown in the figure, the constant current generation circuit 15 may be constituted by an operational amplifier, a transistor, and a resistor. For example, the resistor is connected to a drain of the transistor, a non-inverting input end of the operational amplifier is applied with a band gap reference voltage, and an inverting input terminal is connected to a connection point between the transistor and the resistor. An output terminal of the operational amplifier is connected to a gate of the transistor. For example, a P-type MOS transistor may be used as the transistor.

The switching unit 16 is a circuit that performs a switching operation to switch a connection destination of an input end of the biasing circuit 12 to the constant voltage generation circuit 14 or the constant current generation circuit 15. The switching unit 16 includes a switch 16a. The switch 16a may be, for example, a switch by a transistor, or may be a contact/non-contact type switch that switches on/off by bringing a plurality of conductors into a contact state or a non-contact state.

The switching unit 16 switches the connection destination of the biasing circuit 12 to the constant voltage generation circuit 14 or the constant current generation circuit 15 under the control of the control unit 17, which will be described later, according to an output mode of a high-frequency signal with an amplitude modulation component amplified by the amplification circuit 11. As the output mode, the high output mode in which a high-frequency signal having no less than the predetermined output power is outputted, and the low output mode in which a power less than the predetermined output power is outputted are configured.

For example, when a distance between a mobile communication device including the high-frequency module 1 having the power amplification module 10 and a receiver is long, a power of a high-frequency signal outputted from the amplification circuit 11 needs to be increased, so that the high output mode is used. When the distance between the mobile communication device including the high-frequency module 1 having the power amplification module 10 and the receiver is short, in a case of low bit rate communication, or the like, the power of the high-frequency signal outputted from the amplification circuit 11 need not be increased, so that the low output mode is used. During the waiting time in which the output of the amplification circuit 11 is suppressed, the low output mode may be used.

Note that, in the present embodiment, the high output mode corresponds to a first mode, and the low output mode corresponds to a second mode. Also, the predetermined output power is 17 dBm in the case of the 3G scheme, or the 4G scheme, for example. Thus, at least in communication using the 3G scheme or the 4G scheme, a linear operation of the power amplification module can be realized. Note that, the predetermined output power is not limited to the above, and may be an output power having other values.

The control unit 17 is a control circuit (e.g., embodied as a controller or processor) for controlling the switching operation of the switching unit 16. The control unit 17 may be, for example, a microcomputer or the like. For example, the control unit 17 controls the operation of the switch 16a of the switching unit 16 such that in the low output mode, the connection destination of the input end of the biasing circuit 12 is the constant current generation circuit 15, and in the high output mode, the connection destination of the biasing circuit 12 is the constant voltage generation circuit 14.

The RFIC 20 is an IC in which a large part of a high-frequency analog transmission/reception circuit and a control circuit thereof that are required for a mobile communication device is integrated, except for a duplexer, a transmission power amplifier, an antenna switch, and the like.

As shown in FIG. 1, the RFIC 20 includes the determination unit 21. The determination unit 21 determines whether the output mode of the amplification circuit 11 is set to the high output mode or to the low output mode. The determination unit 21 is not limited to determining the output mode set in advance, and may also determine the output mode according to a distance between a receiver for receiving a power outputted from the high-frequency module 1 and the high-frequency module 1, as will be described later.

[2. Operation of Power Amplification Module]

Figure 3A:
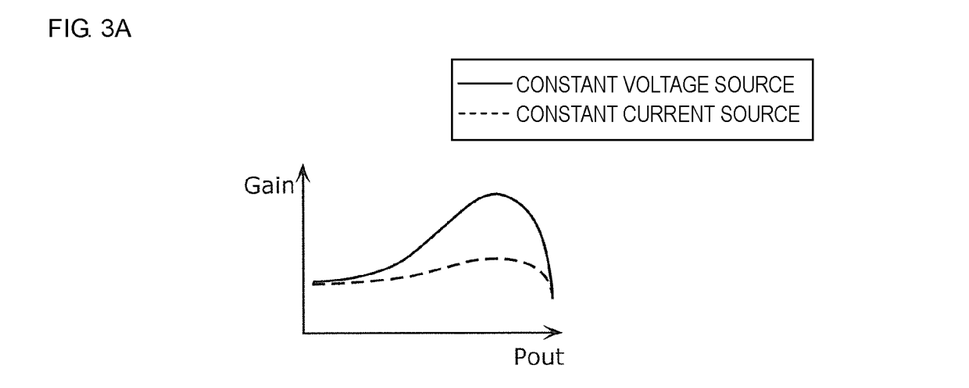
FIG. 3A is a diagram showing the gain of the amplification circuit, when the power amplification module according to the first embodiment is in a second mode, and each of a constant voltage generation circuit and a constant current generation circuit is used.
Figure 3B:
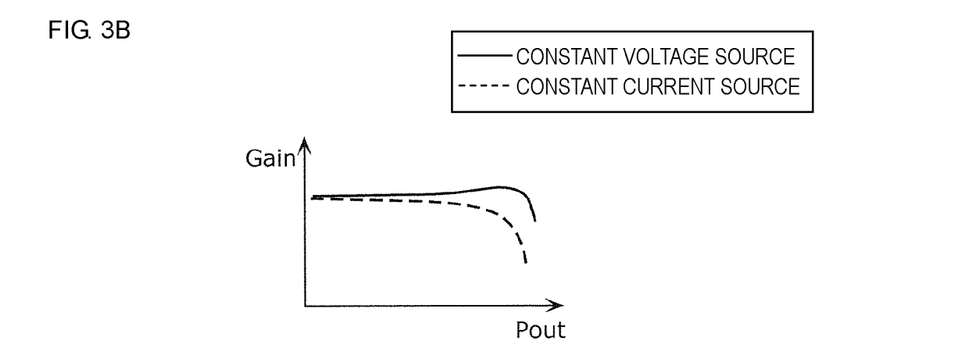
FIG. 3B is a diagram showing the gain of the amplification circuit, when the power amplification module according to the first embodiment is in a first mode, and each of the constant voltage generation circuit and the constant current generation circuit is used.

Next, an operation of the power amplification module 10 will be described. FIG. 3A is a diagram showing the gain of the amplification circuit 11, when the power amplification module 10 operates in the low output mode, and each of the constant voltage generation circuit 14 and the constant current generation circuit 15 is used. FIG. 3B is a diagram showing the gain of the amplification circuit, when the power amplification module 10 operates in the high output mode, and each of the constant voltage generation circuit 14 and the constant current generation circuit 15 is used. Note that, in FIG. 3A and FIG. 3B, a horizontal axis denotes the power outputted from the constant voltage generation circuit 14 or the constant current generation circuit 15 using a logarithmic scale (dBm), and a vertical axis denotes the gain of the amplification circuit 11.

The output mode of the power amplification module 10 is set in advance in the RFIC 20, for example. The output mode of the power amplification module 10 is determined by the determination unit 21 of the RFIC 20, and is transmitted to the control unit 17. Note that, a configuration may be adopted in which the output mode is transmitted from an outside of the power amplification module 10. For example, a configuration may be adopted in which the output mode is transmitted from a receiver (base station or the like) that receives a high-frequency signal transmitted from the high-frequency module 1 having the power amplification module 10. The control unit 17 can determine the output mode according to an output mode signal received from an outside of the control unit 17, for example, and cause the switching unit to perform switching according to the determined output mode.

When the output mode is the low output mode, in general, and a base voltage of the amplification circuit 11 is decreased to suppress an idle current, and the transistor 111 of the amplification circuit 11 is operated in a vicinity of a threshold value, the gain at low power output tends to be decreased. Here, the constant voltage generation circuit 14 is connected to the biasing circuit 12, and a constant voltage is supplied from the constant voltage generation circuit 14 to the biasing circuit 12, with the constant voltage generation circuit 14 being a driving source. In this case, as shown in FIG. 3A, a base current is increased greatly as a power is increased, and the gain of the amplification circuit 11 is increased. That is, the linearity of the gain of the amplification circuit 11 is deteriorated.

Thus, when the output mode is the low output mode, a constant current is supplied from the constant current generation circuit 15 to the biasing circuit 12. Specifically, when the fact that the output mode is the low output mode is transmitted to the control unit 17, the control unit 17 causes the switch 16a of the switching unit 16 to perform switching to connect the biasing circuit 12 to the constant current generation circuit 15. A current having a magnitude as large as a current that flows between a base and an emitter of the transistor 111 is supplied from the constant current generation circuit 15.

When the constant current generation circuit 15 is used, since the biasing circuit 12 has high impedance, the base current can be limited even when the power is increased, as shown in FIG. 3A. Accordingly, as shown in FIG. 3A, the linearity of the gain of the amplification circuit 11 can be maintained. Thus, a linear operation of the power amplification module 10 can be realized in the low output mode.

Further, when the output mode is the high output mode, the constant current generation circuit 15 is connected to the biasing circuit 12, and a constant current is supplied from the constant current generation circuit 15 to the biasing circuit 12 with the constant current generation circuit 15 being a driving source, as shown in FIG. 3B, the base current is decreased as the power is increased. Thus, the gain of the amplification circuit 11 is decreased. That is, the linearity of the gain of the amplification circuit 11 is deteriorated.

Thus, when the output mode is the high output mode, a constant current is supplied from the constant voltage generation circuit 14 to the biasing circuit 12. Specifically, when the fact that the output mode is the high output mode is transmitted to the control unit 17, the control unit 17 causes the switch 16a of the switching unit 16 to perform switching to connect the biasing circuit 12 to the constant voltage generation circuit 14. When the constant voltage generation circuit 14 is used, the biasing circuit 12 has low impedance, and thus even when the power is increased, the power can be supplied without limiting the base current. Thus, as shown in FIG. 3B, the gain of the amplification circuit 11 is not decreased, so that the linearity can be maintained. Thus, the linear operation of the power amplification module 10 can be realized in the high output mode.

Here, when a high-frequency signal with an amplitude modulation component is inputted to the amplification circuit 11, the control unit 17 may determine the output mode to be the high output mode or the low output mode. Also, the control unit 17 may determine the output mode to be the low output mode in the waiting time in which an output of the amplification circuit 11 is suppressed. The waiting time is, for example, the time in which a power is inputted to the amplification circuit 11 such that a minimum output power required to maintain communication with a receiver is obtained. As a result, an idle current in the waiting time can be decreased, and power saving can be achieved.

[3. Effects and the Like]

As described above, in the power amplification module 10 according to the present embodiment, when the output mode is the low output mode, the control unit 17 causes the switch 16a of the switching unit 16 to perform switching to connect the constant current generation circuit 15 to the input end of the biasing circuit 12. Thus, the linearity of the gain of the amplification circuit 11 can be maintained in the low output mode. In addition, when the output mode is the high output mode, the control unit 17 causes the switch 16a of the switching unit 16 to perform switching to connect the constant voltage generation circuit 14 to the input end of the biasing circuit 12. Thus, in the high output mode, the gain of the amplification circuit 11 is not decreased, so that the linearity can be maintained.

Thus, in both the high output mode and the low output mode, the linear operation can be realized.

Second Embodiment

Figure 4:
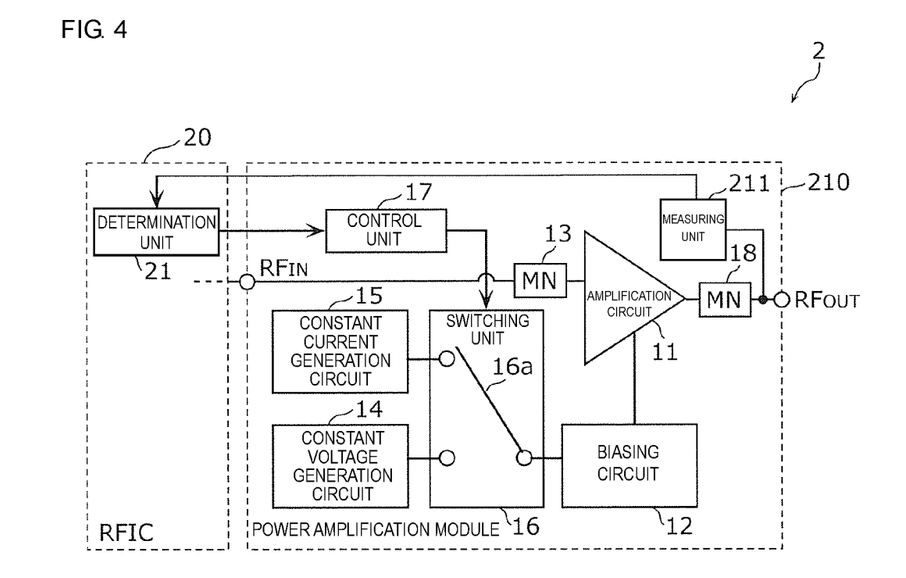
FIG. 4 is a schematic diagram showing a configuration of a power amplification module according to a second embodiment.

Next, a high-frequency module 2 and a power amplification module 210 according to a second embodiment will be described with reference to FIG. 4. FIG. 4 is a schematic diagram showing a configuration of the power amplification module 210 according to the present embodiment.

The power amplification module 210 according to the present embodiment is different from the power amplification module 10 according to the first embodiment in that the power amplification module 210 includes a measuring unit 211.

As shown in FIG. 4, in the power amplification module 210, the measuring unit 211 is connected to an output terminal of the high-frequency module 2. The measuring unit 211 measures (detects) a reception level (power) of the high-frequency module 2 transmitted from a receiver, and transmits the measured reception level to the determination unit 21. The measuring unit 211 may be provided in a coupler or like sensor (not shown in the figure) in the high-frequency module 2, for example. Note that, the reception level is determined according to a distance between the receiver and the high-frequency module 2, and an output voltage of the high-frequency module 2 is determined according to the reception level.

Whether the reception level measured by the measuring unit 211 is larger than a predetermined power or not is determined by the determination unit 21. In addition, when the reception level is larger than the predetermined power, the determination unit 21 determines that the output mode is the high output mode, and transmits the fact that the output mode is the high output mode to the control unit 17. The control unit 17 causes the switch 16a of the switching unit 16 to perform switching to connect the biasing circuit 12 to the constant voltage generation circuit 14. Thus, a linear operation of the power amplification module 210 can be realized in the high output mode.

Further, when the reception level measured by the measuring unit 211 is smaller than the predetermined power, the determination unit 21 determines that the output mode is the low output mode, and transmits the fact that the output mode is the low output mode to the control unit 17. The control unit 17 causes the switch 16a of the switching unit 16 to perform switching to connect the biasing circuit 12 to the constant current generation circuit 15. Thus, the linear operation of the power amplification module 210 can be realized in the low output mode.

As described above, according to the power amplification module 210 of the present embodiment, the power amplification module 210 includes the measuring unit 211, the measuring unit 211 measures the reception level of the high-frequency module 2, and the output mode is determined according to the measured reception level. Thus, regardless of whether the output mode of the high-frequency module 2 is determined to be the high output mode or the low output mode according to the reception level, the linear operation of the power amplification module 210 can be realized.

MODIFICATION EXAMPLE

Note that, as described above, the high-frequency module 2 is not limited to have the configuration including the power amplification module 210 and the RFIC 20, and may include other configurations.

Figure 5:
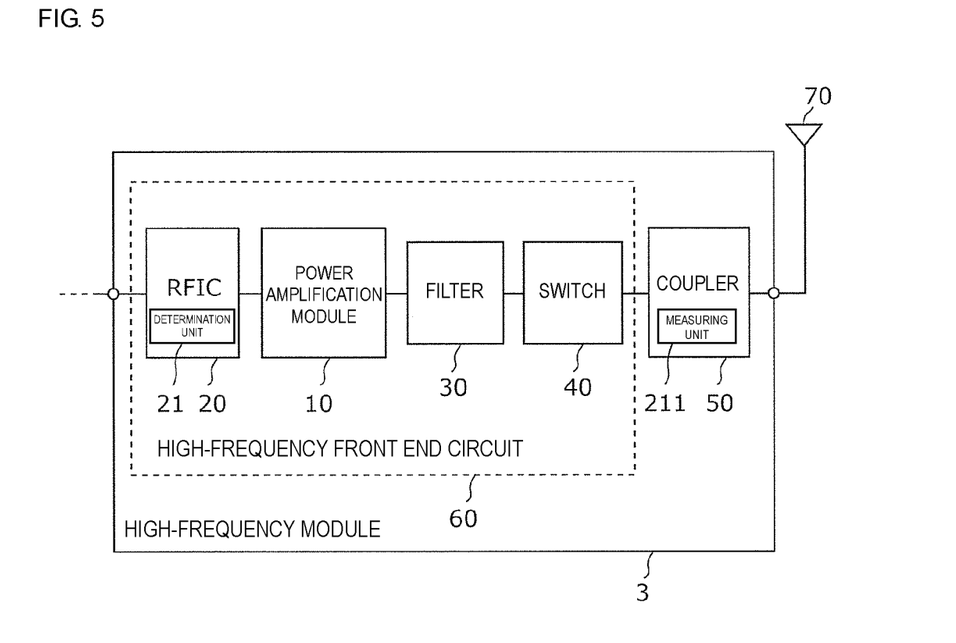
FIG. 5 is a schematic diagram showing a configuration of a high-frequency module according to a modification example of the embodiment.

FIG. 5 is a schematic diagram showing a configuration of a high-frequency module 3 according to a modification example of the embodiments. The high-frequency module 3 may be configured to include, for example, the power amplification module 10 and the RFIC 20 described above, a filter 30, a switch 40, and a coupler 50. Here, a high-frequency front end circuit 60 is constituted by, for example, the power amplification module 10, the RFIC 20, the filter 30, and the switch 40.

The high-frequency front end circuit 60 is a circuit for filtering a high-frequency signal amplified by the power amplification module 10, switching between a transmission signal transmitted to a receiver and a reception signal received from the receiver, and the like. A high-frequency signal outputted from the high-frequency front end circuit 60 is transmitted from an antenna 70 to the receiver through the coupler 50.

In addition, as described above, the RFIC 20 includes the determination unit 21. The determination unit 21 determines an output mode based on a distance between the power amplification module 10 and a receiver for receiving a high-frequency signal outputted from the power amplification module 10. At this time, the determination unit 21 may determine not only the output mode, but also a predetermined output value for determining the output mode, based on the distance between the power amplification module 10 and the receiver for receiving the high-frequency signal outputted from the power amplification module 10. Note that, the high-frequency signal outputted from the power amplification module 10 includes a high-frequency signal outputted from the power amplification module 10, and outputted from the high-frequency module 3 through another configuration such as a filter.

Additionally, the coupler 50 is connected to a path between the high-frequency front end circuit 60 and the antenna 70 to match input/output impedance between the high-frequency front end circuit 60 and the antenna 70. Note that, the coupler 50 may be provided with the measuring unit 211 described in the second embodiment.

Note that, it is sufficient that the high-frequency front end circuit 60 includes at least the power amplification module 10 and the RFIC 20, and a configuration may be adopted in which the filter 30, the switch 40, and the like described above are not included.

Since the high-frequency front end circuit 60 includes at least the power amplification module 10 and the RFIC 20 as described above, the linearity of a high-frequency signal outputted from the high-frequency front end circuit 60 can be maintained. Thus, a linear operation of the high-frequency front end circuit 60 can be realized.

Other Embodiments

Note that, the present disclosure is not limited to the configurations described in the above embodiments, and may be modified as appropriate, for example, as in modification examples described below.

For example, in the embodiments described above, as the output modes of the high-frequency signal, two types, that is, the high output mode and the low output mode are described, but the output modes are not limited to the two types, and three or more types may be used. Further, the predetermined output voltage described above is not limited to 17 dBm, and may be changed as appropriate.

In addition, output modes may be configured in advance by an RFIC, or output modes configured in advance may be transmitted from equipment outside a power amplification module. Further, an output mode may be determined from a measurement value of a high-frequency signal outputted from an amplification circuit.

Further, it is sufficient that a high-frequency module includes at least a power amplification module and an RFIC, and a configuration may be adopted, for example, in which, in addition thereto, a coupler, a switch and a filter are included. Furthermore, a high-frequency module may be configured to further include a BBIC. Further, it is sufficient that a front end circuit includes at least a power amplification module and an RFIC, and a configuration may be adopted in which, in addition thereto, a filter, a switch, and the like are included.

Further, respective configurations of a constant voltage generation circuit and a constant current generation circuit are not limited to the configurations described above, and arbitrary configurations may be adopted as long as a constant voltage and a constant current are outputted, respectively. Further, a switch constituting a switching unit may be, for example, a switch by a transistor, or a contact/non-contact type switch that switches on/off by bringing a plurality of conductors into a contact state or a non-contact state.

In addition, modes that are obtained by applying various modifications that those skilled in the art can think of to the above-described embodiments, or modes that are realized by arbitrarily combining the constituent elements with the functions in the above-described embodiments without departing from the spirit and scope of the present disclosure are also included in the present disclosure.

The present disclosure can be used for a mobile communication device (terminal) such as a mobile phone, a base station, or the like, which includes a high-frequency module, a transmission device, and the like, having a power amplifier.

1, 2, 3 HIGH-FREQUENCY MODULE
10, 210 POWER AMPLIFICATION MODULE
11, 11a, 11b AMPLIFICATION CIRCUIT
12, 12a, 12b BIASING CIRCUIT
13, 13a, 13b, 18 MATCHING CIRCUIT
14 CONSTANT VOLTAGE GENERATION CIRCUIT
15 CONSTANT CURRENT GENERATION CIRCUIT
16 SWITCHING UNIT
16a SWITCH
17 CONTROL UNIT
20 RFIC
21 DETERMINATION UNIT
30 FILTER
40 SWITCH
50 COUPLER
60 HIGH-FREQUENCY FRONT END CIRCUIT
70 ANTENNA
111, 121, 122, 123 TRANSISTOR
211 MEASURING UNIT

The invention claimed is:

1. A power amplification module, comprising:
an amplification circuit configured to amplify a high-frequency signal, the high-frequency signal having an amplitude modulation component;
a biasing circuit configured to bias the amplification circuit to an operating level;
a constant voltage generation circuit configured to supply a constant voltage to the biasing circuit;
a constant current generation circuit configured to supply a constant current to the biasing circuit;
a switch configured to selectively connect an input end of the biasing circuit to the constant voltage generation circuit or to the constant current generation circuit; and
a control circuit configured to control operation of the switch according to an output mode of the amplified high-frequency signal, wherein:
the control circuit is configured to cause the switch to connect the constant voltage generation circuit to the input end of the biasing circuit when the output mode is a first output mode in which an output power of the amplification circuit is at least a predetermined output power, and
the control circuit is configured to cause the switch to connect the constant current generation circuit to the input end of the biasing circuit when the output mode is a second output mode in which the output power of the amplification circuit is less than the predetermined output power.

2. The power amplification module according to claim 1, wherein the control circuit is further configured to determine the output mode is to be the first output mode or the second output mode when the high-frequency signal is inputted to the amplification circuit.

3. The power amplification module according to claim 1, wherein the control circuit is configured to determine the output mode while an output of the amplification circuit is suppressed.

4. The power amplification module according to claim 2, wherein the control circuit is configured to determine the output mode while an output of the amplification circuit is suppressed.

5. The power amplification module according to claim 1, further comprising:
a sensor configured to measure the output power of the amplification circuit, wherein:
the control circuit is configured to determine the output mode is the first output mode when an output power measured by the sensor is at least the predetermined output power, and
the control circuit is configured to determine the output mode is the second output mode when the output power measured by the sensor is less than the predetermined output power.

6. The power amplification module according to claim 1, wherein the predetermined output power is 17 dBm.

7. The power amplification module according to claim 2, wherein the predetermined output power is 17 dBm.

8. The power amplification module according to claim 3, wherein the predetermined output power is 17 dBm.

9. The power amplification module according to claim 5, wherein the predetermined output power is 17 dBm.

10. A method for controlling a power amplification module, comprising:
determining whether an output mode of an amplification circuit is to be a first output mode or a second output mode when a high-frequency signal is inputted to the amplification circuit, wherein the high-frequency signal has an amplitude modulation component and an amplified high-frequency signal is outputted from the amplification circuit, the first output mode is an output mode in which an output power of the amplification circuit is at least a predetermined output power, and the second output mode is an output mode in which an output power of the amplification circuit is less than the predetermined output power;
connecting a constant voltage generation circuit to an input end of a biasing circuit when the output mode is the first output mode, the constant voltage generation circuit being configured to supply a constant voltage and the biasing circuit being configured to bias the amplification circuit to an operating level; and
connecting a constant current generation circuit to the input end of the biasing circuit when the output mode is the second output mode, the constant current generation circuit being configured to supply a constant current.

11. The method for controlling a power amplification module according to claim 10, wherein the predetermined output power is 17 dBm.

12. A high-frequency front end circuit, comprising:
the power amplification module according to claim 1; and
a radio-frequency integrated circuit (RFIC) being configured to determine the output mode of the amplification circuit.

13. The high-frequency front end circuit according to claim 12, wherein the RFIC is configured to determine the output mode based on a distance between the power amplification module and a receiver configured to receive the amplified high-frequency signal.

14. The high-frequency front end circuit according to claim 12, wherein the RFIC is configured to determine the predetermined output power based on a distance between the power amplification module and a receiver configured to receive the amplified high-frequency signal.

15. The high-frequency front end circuit according to claim 13, wherein the RFIC is configured to determine the predetermined output power based on a distance between the power amplification module and the receiver.

\* \* \* \* \*